(12) United States Patent
Ferrell et al.

(10) Patent No.: US 6,270,584 B1
(45) Date of Patent: *Aug. 7, 2001

(54) APPARATUS FOR DRYING AND CLEANING OBJECTS USING CONTROLLED AEROSOLS AND GASES

(76) Inventors: Gary W. Ferrell, 608 Terrace, Half Moon Bay, CA (US) 94019; Thomas D. Spencer, 343 Amador Ave., Millbrae, CA (US) 94030; Rob E. Carter, 31 Summit St., Arlington, MA (US) 02174

( * ) Notice: Subject to any disclaimer, the term of this patent is extended or adjusted under 35 U.S.C. 154(b) by 0 days.

This patent is subject to a terminal disclaimer.

(21) Appl. No.: 09/417,203

(22) Filed: Oct. 11, 1999

Related U.S. Application Data

(60) Division of application No. 09/090,453, filed on Jun. 4, 1998, now Pat. No. 5,968,285, which is a continuation-in-part of application No. 08/984,413, filed on Dec. 3, 1997, now Pat. No. 5,964,958.

(51) Int. Cl.$^7$ ....................................................... B08B 3/04
(52) U.S. Cl. ................................. 134/26; 134/21; 134/30; 134/31; 134/95.2; 134/95.3; 134/100.1; 134/102.2; 134/198; 134/902; 34/61; 34/79; 34/202; 34/218; 34/221; 34/164; 34/340; 34/342; 34/401
(58) Field of Search ................................. 134/21, 26, 30, 134/31, 95.2, 95.3, 902, 100.1, 102.2, 198; 34/61, 79, 202, 218, 221, 164, 340, 342, 401

(56) References Cited

U.S. PATENT DOCUMENTS 4,702,418 * 10/1987 Carter et al. .......................... 239/101
5,449,502 * 9/1995 Igusa et al. ........................... 422/292
5,653,045 * 8/1997 Ferrell ..................................... 34/341
5,685,086 * 11/1997 Ferrell ..................................... 34/61
5,964,958 * 10/1999 Ferrell ..................................... 134/26
5,968,285 * 10/1999 Ferrell et al. ........................... 134/26
6,036,785 * 3/2000 Ferrell ..................................... 134/1

FOREIGN PATENT DOCUMENTS

WO 97/33702 * 3/1997 (WO) .

* cited by examiner

*Primary Examiner*—Sharidan Carrillo
(74) *Attorney, Agent, or Firm*—Timothy H. Gens; John Schipper

(57) ABSTRACT

Method and apparatus for cleaning and/or drying objects that may have been wetted or contaminated in a manufacturing process. The objects are submerged in a rinse liquid in an enclosed chamber, and aerosol particles from a selected liquid are introduced into the chamber above the rinse liquid surface, forming a thin film on this surface. As the rinse liquid is slowly drained, some aerosol particles settle onto the exposed surfaces of the objects, and displace and remove rinse liquid residues from the exposed surfaces by a "chemical squeegeeing" effect. Surface contaminants are also removed by this process. Chamber pressure is maintained at or near the external environment pressure as the rinse liquid is drained from the chamber. Inert gas flow is employed to provide aerosol particles of smaller size and/or with greater dispersion within the chamber. Continuous filtering and shunt filtering are employed to remove most contaminants from the selected liquid. A flow deflector redirects initial flow of the selected liquid to a supplementary filter, to remove most of the contaminant particle "spike" that appears when a system is first (re)activated. An improved surface for aerosol particle production is provided.

23 Claims, 7 Drawing Sheets

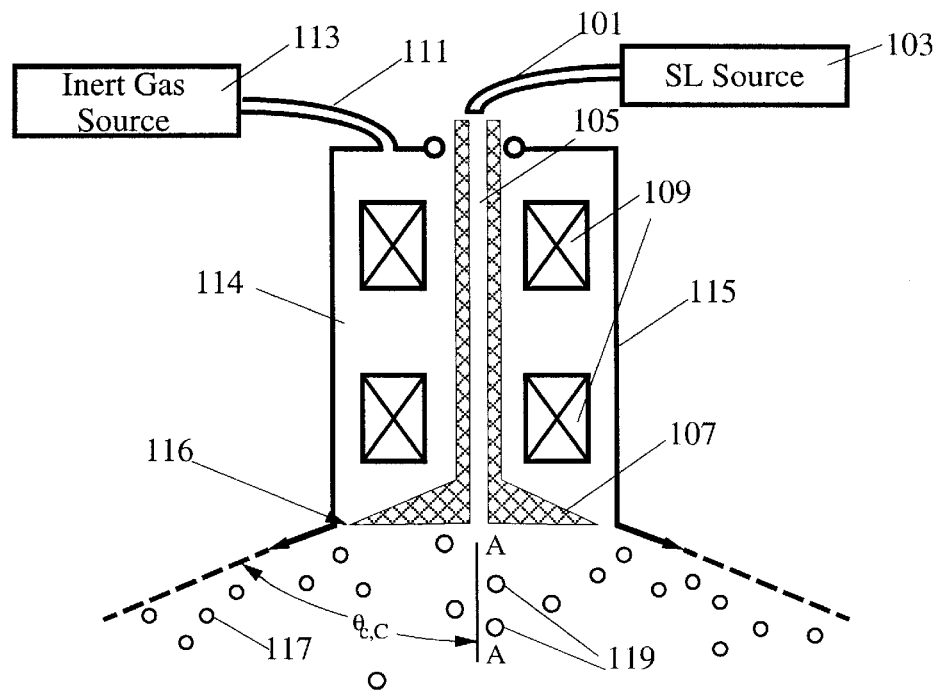
FIG. 2C
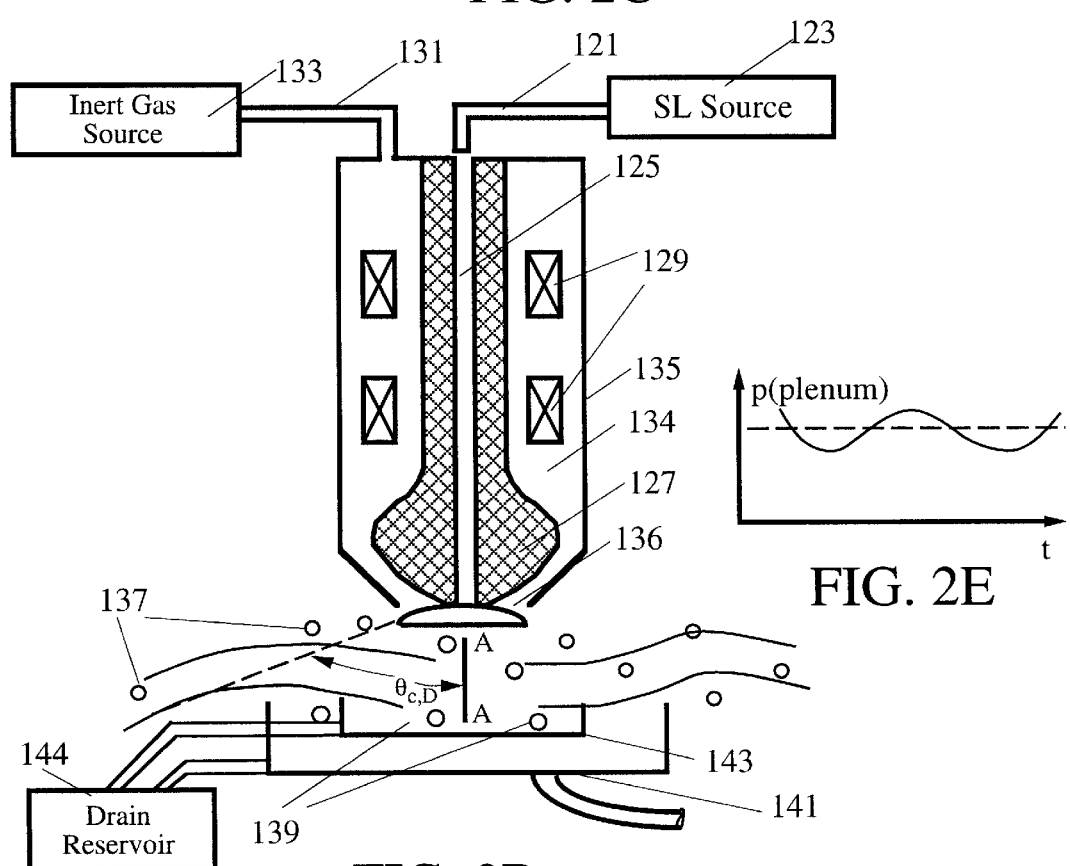
FIG. 2D
FIG. 2E

APPARATUS FOR DRYING AND CLEANING OBJECTS USING CONTROLLED AEROSOLS AND GASES

This is a division patent application of U.S. Ser. No. 09/090,453, filed Jun. 4, 1998, now U.S. Pat. No. 5,968,285, which is a continuation in part patent application of U.S. Ser. No. 08/984,413, filed Dec. 3, 1997, now U.S. Pat. No. 5,964,958.

FIELD OF THE INVENTION

This invention relates to improvements in drying and cleaning of manufactured objects, including electronic components, using aerosols created by sonic or ultrasonic means.

BACKGROUND OF THE INVENTION

Objects that are being manufactured using processes involving application of liquids and other fluids often require that the parts be thoroughly dried before the manufacturing process can continue. For example, in fabrication of integrated circuits, doping, photomasking, etching and passivation processes often require application of particular liquids at one stage and removal of liquid residues before the next stage proceeds. Drying and removal of these liquid residues must be complete, but the drying process should, ideally, occur in a relatively short time interval and with expenditure of a minimum of energy and chemicals to implement the drying process.

Several workers have disclosed methods for drying parts, including integrated circuits, by use of heated or superheated gases. These approaches heated or superheated gases or direct beam irradiation to dry an object surface; or they use cooperative action by an ultrasonic beam and an active chemical bath to remove contaminants from, or to apply a desired material to, an object surface. These approaches are complex, usually require operation at high temperatures, often require processing times of several minutes, and often require use of specially resistant chamber walls for the processing chamber.

What is needed is a method and associated apparatus for drying and cleaning objects in a manufacturing process that works well at room temperature and is simple, that is demonstrably complete, with no significant residues, that can be accomplished in times as short as one minute, that can be performed in a chamber with chamber walls made of almost any material, and that requires use of only a very small amount of a drying agent, with minimal expenditure of energy, particularly thermal energy. Preferably, the process should be performable over a wide range of temperatures, and should be easily scalable to any size surface.

SUMMARY OF THE INVENTION

The needs are met by the invention, which provides improvements for a method and associated apparatus for drying and/or cleaning objects by use of a small amount of a low surface tension liquid plus (optionally) brief application of a recyclable cleaning agent. In one embodiment, the objects to be dried are submerged in a rinse liquid, such as water, in a chamber. The rinse liquid surface is covered with a very thin film of a low surface tension selected liquid, such as isopropyl alcohol ("IPA"), formed from an aerosol created by sonic or ultrasonic vibrations of a small stream of the selected liquid. Other suitable liquids include ethyl alcohol, methyl alcohol, tetrahydrofuran, acetone, perfluorohexane, hexane and ether. The thin film is continually replenished as needed, and the rinse liquid covering the objects to be dried is slowly drained. As the rinse liquid and thin film drain, the selected liquid briefly contacts the surfaces of the objects and removes water residues by a "chemical squeegeeing" process that is discussed later. Optionally, the objects can be subjected to an additional chamber purge or drying process, using a heated or ambient temperature cleaning fluid, such as dry $N_2CO$ or $CO_2$ gas, after the chamber has been drained. Optionally, chamber pressure is maintained near or above the external environment pressure as the rinse liquid is drained from the chamber.

In a first improvement, high velocity flow of a supplemental gas provides a controllable expansion of the selected liquid and produces a "fog" with reduced aerosol diameters and improved drying and/or cleaning action.

In a second improvement, controlled flow of a supplemental gas, combined with a mask that captures the heavier selected liquid particles (e.g., those with aerosol diameters>10 $\mu$m), produces a fog with reduced aerosol diameters and improved drying and/or cleaning action.

In a third improvement, the selected liquid is continuously circulated and filtered to continually remove substantially all contaminants with diameters greater than a selected value, such as 0.05 $\mu$m.

In a fourth improvement, a shutter is used on the delivery system for the selected liquid to suppress or substantially eliminate contaminant particle "spikes" that occur during a start-up phase of the delivery apparatus.

In a fifth improvement, an improved aerosol particle production system, using an inert particle formation surface, is provided that provides improved control of aerosol diameters and allows production of much smaller diameters.

Process parameters that can be varied to control the process include vibration frequency for creation of aerosol particles from the selected liquid, a representative aerosol particle diameter, delivery rate for the selected liquid, pressure and temperature at which the selected liquid is delivered for creation of the aerosol particles, temperature of the drying fluid used (if any), and choice of the selected liquid and of the drying fluid used (if any).

The invention requires as little as 1–2 milliliters (ml) of the selected liquid to dry objects in a chamber with volume of 10–20 liters, or smaller or larger, if desired. This approach provides several benefits. First, the process is carried out at or near room temperature, with little energy expenditure, and does not require use of heated or superheated liquids or gases for drying. Second, the process uses a very small amount of the selected liquid in a large volume of rinse liquid (10–20 liters) so that the mixture of rinse liquid and selected liquid can normally be disposed of without the special handling procedures required for hazardous materials. Third, a wide variety of inexpensive selected liquids can be used. Fourth, use of a covering film of selected liquid minimizes vapor from the rinse liquid remaining in the chamber after drainage. Fifth, the process is easily scaled up or down, with no substantial changes in the apparatus. Sixth, the process removes large diameter contaminants that are not chemically bound to an object surface.

BRIEF DESCRIPTION OF THE DRAWINGS

FIG. 1 illustrates suitable apparatus, in one embodiment, for practicing the invention, with the objects submerged in a rinse liquid in a chamber.

FIGS. 2A, 2B, 2C and 2D are schematic views of aerosol creating vibrating nozzles suitable for use with the invention.

DESCRIPTION OF BEST MODES OF THE INVENTION

Figure 1:
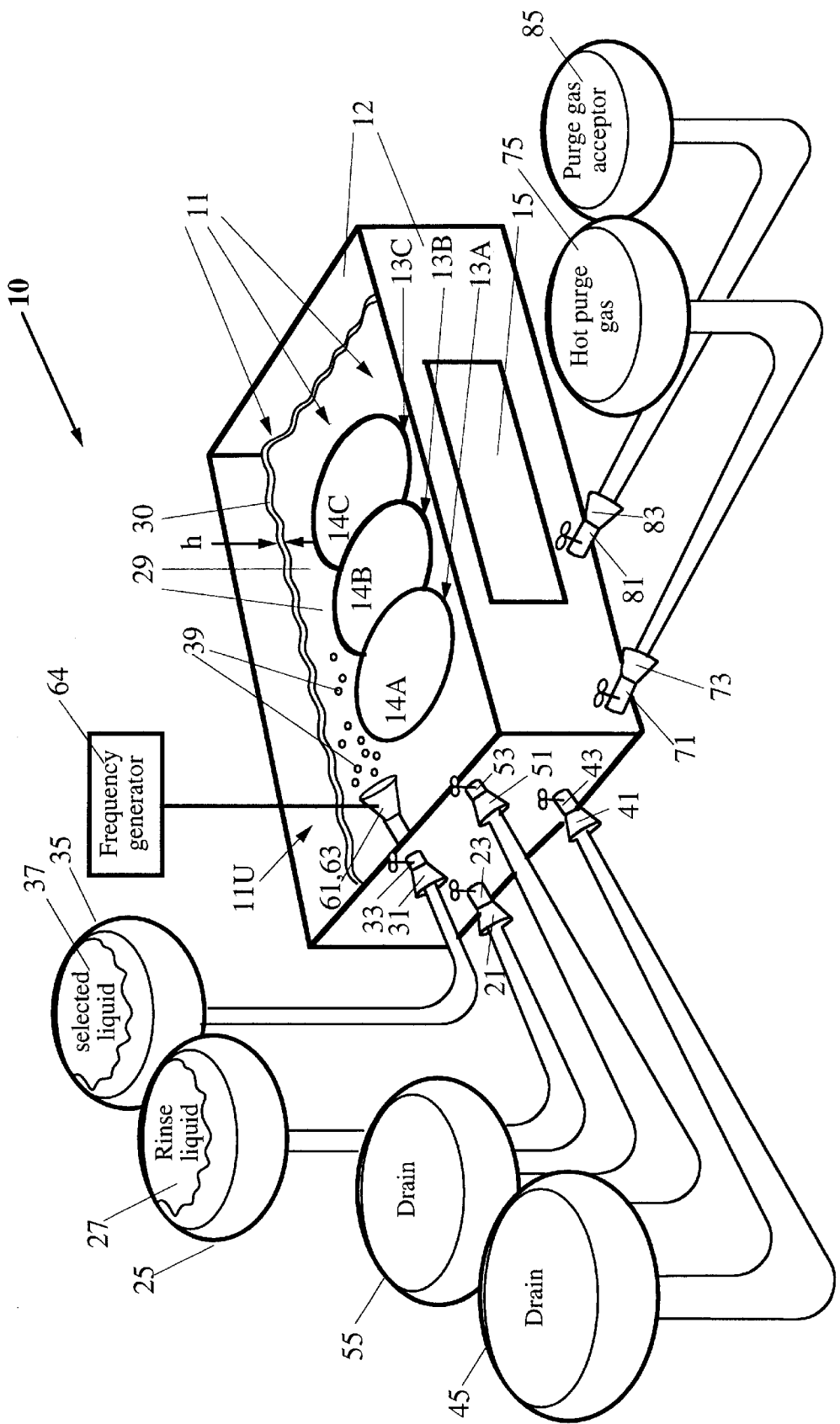

FIG. 1 illustrates one embodiment of apparatus 10 that is useful for practicing the invention. An enclosed chamber 11 is defined by a housing 12 and is provided with a rack (optional) for holding the objects 13A, 13B, 13C, etc. to be dried. The objects 13A, 13B, 13C are placed into, and removed from, the chamber 11 through a slidable, hinged or other operable entryway 15 that is part of the housing 12. When the entryway 15 is closed or engaged, the chamber is enclosed, preferably in an gas-tight manner, and any remaining gas in the chamber can optionally be removed. A first port 21 and associated first valve 23 are attached to the housing 12 and are connected to a source 25 of water or other suitable rinse liquid 27 in which the objects 13A, 13B, 13C are initially submerged. A second port 31 and associated second valve 33 are attached to the housing 12 and are connected to a selected liquid source 35, such as a pressurized tank maintained at a pressure of 5-50 psi, of a selected drying liquid or fluid 37 ("selected liquid") that will primarily dry the objects 13A, 13B, 13C.

A third port 41 and associated third valve 43, which may coincide with the first port 21 and first valve 23, are attached to the housing 12 and are connected to a first liquid or fluid tank or other suitable first drain acceptor 45 that receives and drains the rinse liquid 27 and absorbed selected liquid 37 from the chamber 11. A fourth port 51 and associated fourth valve 53, which may coincide with the second port 31 and second valve 33, are attached to the housing 12 and are connected to a second liquid or fluid tank or other suitable second drain means 55 that receives and drains the selected liquid 37, and aerosol droplets 39 from the selected liquid, from the chamber 11.

Initially, the objects 13A, 13B, 13C are placed in the chamber 11 in a rack or cassette (not shown), the entryway 15 is closed or engaged, the chamber has a pressure at or slightly above atmospheric, and rinse liquid 27 is admitted to the chamber through the first port 21 and first valve 23 so that the objects are fully submerged in the rinse liquid. The first valve 23 is then closed. Alternatively, the objects 13A, 13B, 13C may be partly submerged in the rinse liquid 27 so that a portion of the surfaces of these objects are exposed above the exposed surface of the rinse liquid.

A small stream of the selected liquid 37 then passes through the second port 31 and second valve 33 and is received by a piezoelectrically driven head 61 and vibrating sonic or ultrasonic nozzle 63 that vibrates at a selected frequency f lying in the range 10 kHz≦f≦10,000 kHz, and more preferably in the narrower range 20 kHz≦f≦100 kHz. The driven head 61 is connected to and driven by a frequency generator 64 that is preferably located outside the chamber 11 and that permits selection of a vibration frequency f in the indicated range. When the selected liquid 37 is present in the vibrating nozzle 63 and the nozzle is vibrating, the selected liquid is converted into a plurality of aerosol droplets 39 that move into the chamber 11 and occupy most or all of an upper portion 11U of the chamber that is not already filled by the rinse liquid 27 and submerged objects 13A, 13B, 13C.

Figure 2A:
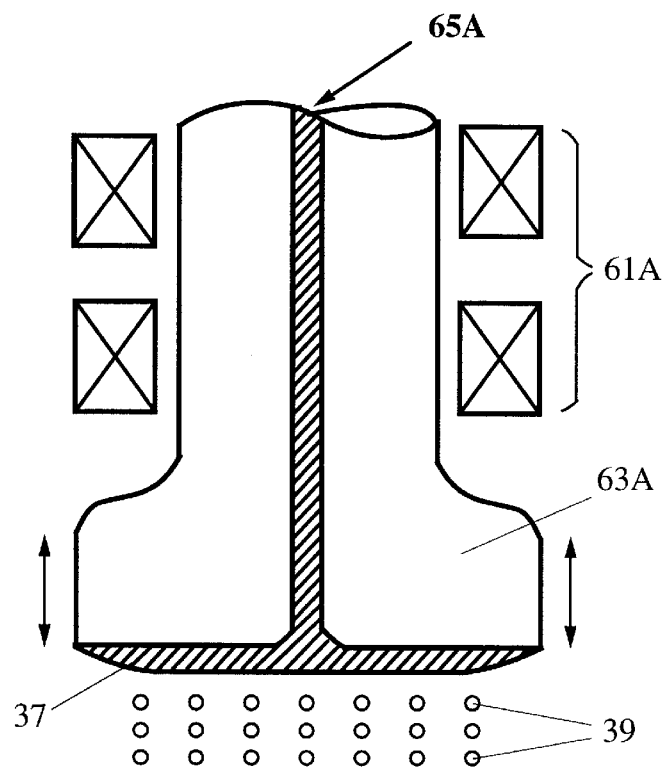
FIG. 2E is a graphical view of inert gas plenum pressure variations with time that are suitable for use with the apparatus in FIG. 2D.

FIG. 2A illustrates a suitable drive head 61A and vibrating nozzle 63A that can be used with the apparatus shown in FIG. 1. The vibrating nozzle 63A preferably has a hollow column 65A formed therein with diameter d(col)≈200 μm, through which the selected liquid 37 (cross-hatched) flows. The vibrating nozzle then "shakes off" small droplets 39 of selected liquid 37, which form aerosol droplets in a roughly cylindrical pattern and move into the portion of the chamber 11 above the rinse liquid.

Figure 2B:
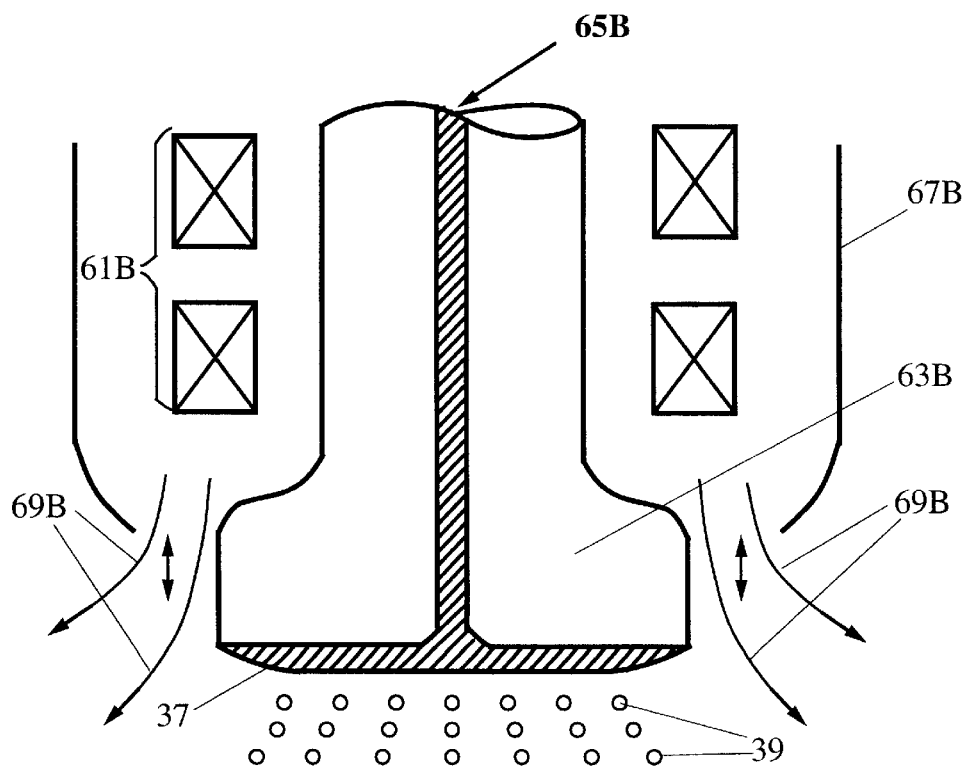

FIG. 2B illustrates another suitable drive head 61B and vibrating nozzle 63B, including a thin hollow column 65B therein through which the selected liquid 37 flows. A housing 67B surrounds the nozzle 63B and directs a ring of hot or cold inert gas 69B toward the aerosol droplets 39, which move into the chamber in a conical or other desired pattern for enhanced distribution of the aerosol droplets throughout the chamber. Many other drive head/vibrating nozzle combinations can also be used here.

We have found that use of a higher frequency f will tend to produce aerosol droplets 39 with a smaller mean diameter d(mean). For a vibration frequency f in the range 20 kHz≦f≦100 kHz, we estimate that the mean aerosol droplet diameter lies in the range 10 μm≦d(mean)≦50 μm. The mean droplet diameter can be varied by varying the diameter (s) d(mem) of the membrane apertures 66 and by varying the frequency f of vibration of the vibrating nozzle 63A or 63B.

The selected liquid 37 should be non-reactive with the objects 13A, 13B, 13C and with the walls of the chamber 11 and should have a substantially lower surface tension than the surface tension of the rinse liquid. Suitable selected liquids include isopropyl alcohol, ethyl alcohol, methyl alcohol, tetrahydrofuran, acetone, perfluorohexane, hexane and ether, as well as many other low surface tension liquids and fluids. Use of any of these substances as a selected liquid does not require provision of chamber walls made of specially-resistant materials.

The selected liquid 37 may be held in the selected liquid source 35 at a pressure of 5–50 psi above atmospheric pressure to facilitate delivery and to suppress the slight volatilization of the selected liquid that might otherwise naturally occur. The preferred rinse liquid, de-ionized water, has a surface tension σ=73 dynes/cm at T≈20° C., and organic molecules such as methyl alcohol, ethyl alcohol, isopropyl alcohol, n-hexane and ether have surface tensions a in the range 17 dynes/cm≦σ<23 dynes/cm at T=20° C. so that σ(selected liquid)<<σ(rinse liquid) at room temperature.

Use of the selected liquid 37 at or near room temperature is preferred here. Use of the selected liquid 37 at a substantially elevated temperature can reduce the surface tension of the rinse liquid 27, relative to the surface tension of the selected liquid 37, and thus interfere with the chemical squeegee effect relied upon for this process.

An aerosol particle is a cluster or collection of molecules of the selected liquid 37 that has not undergone a phase transformation into a vapor form. Thus, the energy E(aerosol) (1.6 Watts for a typical sonic head, or less than 100 Joules/gm at a flow rate of 2 ml/min) required to convert one gram of the selected liquid 37 into aerosol droplets 39, provided by the vibrating nozzle, is much less than the energy of vaporization E(vapor) required to heat and convert one gram of the selected liquid 37 into its vapor form. We estimate that the ratio E(aerosol)/E(vapor) is less than 2 percent. Production of the aerosol particles can be carried out at or near room temperature, and use of a very high temperature, such as T=60–200° C., is neither needed nor advisable for this process. Further, only a small amount of the selected liquid 37, as low as 1–5 ml, is required for drying several objects 13A, 13B, 13C in the chamber 11.

The aerosol droplets 39 move into the chamber 11, and many of these droplets settle onto an exposed surface 29 (preferably calm) of the rinse liquid 27 as a thin film 30 having a varying thickness h(aerosol). An estimated time required to form this thin film 30 is 40–60 sec. A portion of the aerosol droplets 39 that join the film 30 will diffuse into the rinse liquid 27 so that, if this film is not replenished with additional aerosol droplets, the film 30 will quickly and substantially disappear. Preferably, the volume flow rate r(sel) of the selected liquid 37 to the vibrating nozzle 63 is adjusted so that the rate at which aerosol droplets 39 join the film 30 is sufficient to maintain or increase a selected thickness h(aerosol) for the film. A preferred range for the film thickness h(aerosol) is 0.5 mm $\leq$ h(aerosol) $\leq$ 5 mm, but this thickness may be made larger by increasing the volume flow rate r(sel). For a chamber 11 having an exposed (upper) surface for the rinse liquid 27 with an area of about 900 cm$^2$, a volume flow rate r(sel)=r2=1–5 ml per minute of the selected liquid 37 suffices. Usually, a volume flow rate r2=1–2 ml/min is high enough. The time required to drain the chamber at a drain rate of 5 mm/sec is about 20–40 sec for a semiconductor wafer 10–20 cm in diameter. Thus, very little of the selected liquid 37 is absorbed or diffuses into the rinse liquid 27 in the course of the time interval (60–100 sec) required for establishment of the film and draining of the chamber.

Because so little of the selected liquid 37 is used in the process, the selected liquid source 35 may have a relatively small volume, as little as 20–25 ml, and the selected liquid source 35 may be located at a considerable distance, such as 1–4 meters, from the chamber 11. This enhances the safety of the process, where a selected liquid is used that has a low flash point or that can initiate an explosion.

A very small amount of the selected liquid 37 will vaporize naturally at the process temperature, preferably room temperature, based on the equilibrium vapor pressure coefficient of the selected liquid at that temperature. This vaporized portion should be relatively small in the enclosed chamber 11 at room temperature, and the vapor portion of the selected liquid 37 will quickly come to equilibrium with the liquid film and aerosol portions of the selected liquid 37. Use of a process temperature much higher than room temperature would produce a selected liquid 37 with a moderately higher equilibrium vapor pressure coefficient and a concomitantly higher amount of vapor from the selected liquid. This natural vaporization of a small part of the selected liquid 37 is not regarded as a useful part of the drying process.

After a film 30 of the aerosol droplets is established on the surface 29 of the rinse liquid 27, which may require 40–60 sec, the rinse liquid 27 is slowly drained from the chamber 11 through the third port 41 and third valve 43 into the drain tank 45. Draining of the rinse liquid 27 will require an estimated 20–40 sec for a chamber holding 10–20 liters of the rinse liquid 27. A preferred range for the drain rate r(drain) is 3–10 mm/sec decrease in the height of the rinse liquid 27 in the chamber 11, and r(drain)=5 mm/sec is a suitable drain rate for this process. Draining occurs slowly in order to preserve the thin film 30 of the selected liquid 37 at the otherwise-exposed surface 29 of the rinse liquid. As draining of the rinse liquid 27 proceeds, aerosol droplets 39 continue to be produced by flow of a small stream of the selected liquid 37 through the vibrating nozzle 63. The volume flow rate r(sel) of the selected liquid 37 may be adjusted toward higher or lowers values as draining of the rinse liquid 27 (and absorbed aerosol particles 39) proceeds.

FIG. 2C illustrates improved ultrasonic drive apparatus for delivery of a selected liquid, 117 and 119 (e.g., IPA at room temperature) in aerosol form, for cleaning and/or drying an object. A first fluid-carrying line 101 delivers a selected liquid from a selected liquid source 103 to a first end of an axial chamber 105 that is defined by an approximately cylindrical ultrasonic nozzle 107 that vibrates at a frequency f lying in a selected frequency range, such as 10 kHz $\leq$ f $\leq$ 10,000 kHz. The nozzle 107 is driven by an ultrasonic drive head 109, which may include several current-carrying coils. As the direction of coil current is reversed repeatedly, the nozzle 107, which may include a piezoelectric material, is set into vibration by the coil current reversal and "shakes off" small aerosol particles of the selected liquid.

The apparatus in FIG. 2C also includes a second fluid-carrying line 111, fed by an inert gas source 113, that delivers gas to an inert gas plenum 114, with a plenum wall 115 having a small aperture 116 near a second end of the axial chamber 105. The fluid-carrying line 111 preferably delivers inert gas, such as $N_2$ or CO, to the plenum 114 at about room temperature at a flow rate of 2–10 liters per minute (LPM). A portion or all of the inert gas is expelled from the plenum 114 at the plenum aperture 116 in a selected (outward) direction, creating a locally lowered total gas pressure that results in an expanded flow 117 of the selected liquid aerosol particles. In the absence of the inert gas flow through the plenum aperture 116, only the selected liquid aerosol particles 119 would appear, and only in a central region below a second end of the nozzle 107 and surrounding a nozzle axis AA. With inert gas flow through the plenum aperture 116 incorporated, the aerosol particles flow within a larger "cone angle" $\theta_{c,C}$ than would occur in the absence of the inert gas.

FIG. 2D also illustrates improved ultrasonic drive apparatus for delivery of a selected liquid, 137 and 139, in aerosol form, for cleaning and/or drying an object. A first fluid-carrying line 121, a selected liquid source 123, an axial chamber 125 defined by an approximately cylindrical ultrasonic nozzle 127, an ultrasonic drive head 129, a second fluid-carrying line 131, an inert gas source 133, an inert gas plenum 134, a plenum wall 135, and a plenum aperture 136 serve the same purposes as the respective components 101, 103, 105, 107, 109, 111, 113, 114, 115, and 116 in the apparatus of FIG. 2C. The embodiment shown in FIG. 2D will produce aerosol particles 137 with a larger associated cone angle $\theta_{c,D}$ than would occur in the absence of the inert gas.

In FIG. 2D, the inert gas is expelled from the plenum aperture 136, either continuously at roughly constant plenum pressure, or at a plenum pressure p(plenum) that varies roughly periodically with time t between a minimum pressure value and a maximum pressure value, as indicated in FIG. 2E. This pressure variation creates inert gas pressure waves 141 with an associated pressure gradient around the plenum aperture 136. These pressure waves 141 cause aerosol particles 117 spaced apart from a central region of the nozzle 127 to separate into smaller clusters and thereby produce smaller aerosol particles and to expand outward within a wider associated cone angle $\theta_{c,D}$. Aerosol particles 139 that are produced with a central region near an axis of the nozzle 127 will retain their larger particle diameters and will be captured by one or more particle masks or absorbers 141 and 143 that are located in a central region below the nozzle 127. The selected liquid aerosol particles 139 captured by the particle masks 141 and 143 are drained into a reservoir 144 and may be recycled if desired. The embodiment shown in FIG. 2D will produce aerosol particles 137 with a larger associated cone angle $\theta_{c,D}$ and with smaller average aerosol diameters, because the larger diameter aerosol particles tend to move parallel to a nozzle axis AA and tend to be captured by one or more of the centrally located particle masks 141 and 143.

Figure 3:
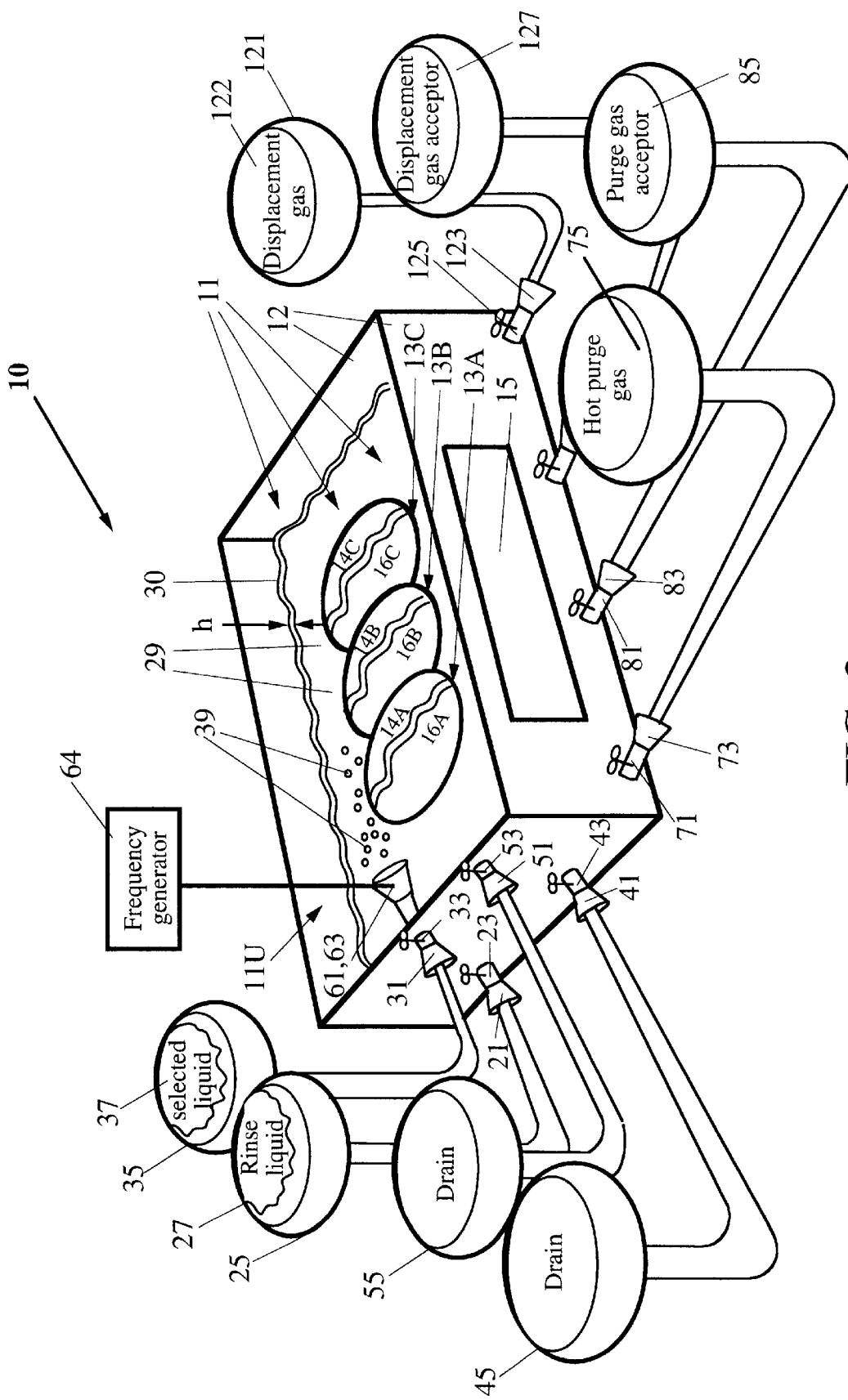
FIG. 3 illustrates the apparatus of FIG. 1 with the rinse liquid partly drained from the chamber.

As the rinse liquid 27 drains from the chamber 11 in FIG. 3, the surfaces 14A, 14B, 14C of the objects 13A, 13B, 13C are increasingly exposed above the exposed rinse liquid surface 29 and overlying film 30, and aerosol droplets 39 in the upper part of the chamber 11U settle onto these exposed surfaces 14A, 14B, 14C, as shown in FIG. 3. Also, a portion of the film 30 of the selected liquid 37 may settle on the exposed portions of the object surfaces 14A, 14B, 14C, rather than moving with the rinse liquid 27 toward the third port 41. The selected liquid 37 is chosen to have a much smaller surface tension σ(sel) than the surface tension ((rinse) of the rinse liquid 27. If the rinse liquid 27 is water, the associated surface tension is σ(rinse)=73 dynes/cm at room temperature. In this instance, the selected liquid 37 may be isopropyl alcohol ("IPA") or ethyl alcohol or methyl alcohol, with the respective surface tensions of σ=21.7 dynes/cm, 22.6 dynes/cm, and 22.8 dynes/cm at room temperature. The selected liquid 37 is also chosen for its ability to displace or solubilize rinse liquid at whatever process temperature is used. Room temperature (T=20° C.), and even lower temperatures, can be used here. The process also works satisfactorily at somewhat higher temperatures.

As exposed portions of the object surfaces 14A, 14B, 14C receive the aerosol droplets 39 of the selected liquid 37, new films 16A, 16B, 16C of the aerosol droplets 39 or selected liquid 37 form on these exposed portions. As draining of the rinse liquid 27 from the chamber 11 proceeds, and after draining is completed, the selected liquid 37 in the films 16A, 16B, 16C displaces most or all of the rinse liquid 27 that remains on the exposed portions of the object surfaces 14A, 14B, 14C, in large part because the surface tension cr(sel) of the selected liquid 37 is much smaller than the surface tension ((rinse) of the rinse liquid 27. The rinse liquid 27 that is displaced by the selected liquid runs down the exposed surfaces 14A, 14B, 14C of the objects 13A, 13B, 13C and is drained away with the bulk of the 25 rinse liquid in the chamber. The selected liquid 37 that forms a film on the surfaces 14A, 14B, 14C of the objects 13A, 13B, 13C also runs down these surfaces and is drained away with the bulk of the rinse liquid 27. The films 16A, 16B, 16C of selected liquid 37 thus act as "chemical squeegees" in removing rinse liquid 27 and selected liquid 37 from the exposed surfaces 14A, 14B, 14C of the objects 13A, 13B, 13C.

This chemical squeegeeing of the objects' exposed surfaces 14A, 14B, 14C has another benefit. The process not only dries the objects' surfaces but also removes most of the larger contaminant particles from these surfaces, if these contaminant particles are not chemically bound to the host surfaces. We have examined some bare silicon surfaces before the chemical squeegeeing process is applied and have found a substantial number of contaminant particles with diameter at least 0.3 $\mu$m on these surfaces, as indicated in column (2) of Table 1. We have then applied the chemical squeegeeing process, have re-examined the same surfaces after completion of the chemical squeegeeing process, and have found the number of contaminant particles is reduced after completion of the chemical squeegeeing process, as shown in column (3) of Table 1. These results indicate that chemical squeegeeing alone removes 12–100 percent of the contaminant particles with diameters greater than 0.3 $\mu$m, depending on size.

TABLE 1

Chemical Squeegee Removal of Large Contaminant Particles

| Particle Size | Particles before Chem. Squeegee | Particles after Chem Squeegee |
|---|---|---|
| 0.329–0.517 $\mu$m | 8 | 7 |
| 0.518–0.810 | 7 | 2 |
| 0.811–1.270 | 7 | 2 |
| 1.271–1.990 | 3 | 1 |
| 1.991–3.130 | 6 | 1 |
| 3.131–4.910 | 6 | 0 |

At about the time the rinse liquid 27 becomes fully drained from the chamber 11 and the surfaces 14A, 14B, 14C of the objects 13A, 13B, 13C are fully exposed, the second port 31 and second valve 33 are closed, the vibrating nozzle 63 is shut down, and the fourth port 51 and fourth valve 53 are opened. The remaining selected liquid 37, aerosol droplets 39, rinse liquid 27, and any vapor from the rinse liquid and selected liquid are then removed from the chamber 11 through the fourth port 51. This portion of the process may require another 10–20 sec. but may be continued for a longer time interval, if desired, to completely remove the remaining selected liquid 37 and any remaining rinse liquid 27 from the films 16A, 16B, 16C and from the chamber 11. Drying of the objects 13A, 13B, 13C is now substantially complete.

Optionally, hot or room temperature dry nitrogen N2, carbon monoxide CO, carbon dioxide $CO_2$ or other inert gas may be admitted into the chamber 11 through a fifth port 71 and associated fifth valve 73 to purge the chamber 11 and/or clean any remaining substances from the exposed surfaces 14A, 14B, 14C of the objects 13A, 13B, 13C. The hot purge gas is received by the chamber 11 from a purge gas tank 75 and is removed through a sixth port 81 and associated sixth valve 83 that may coincide with the fifth port 71 and fifth valve 73, respectively. The hot purge gas is received from the chamber 11 in a spent purge gas tank 85 for recycling, processing or disposal. This portion of the process, if included, may require another 30–60 sec.

Figure 4:
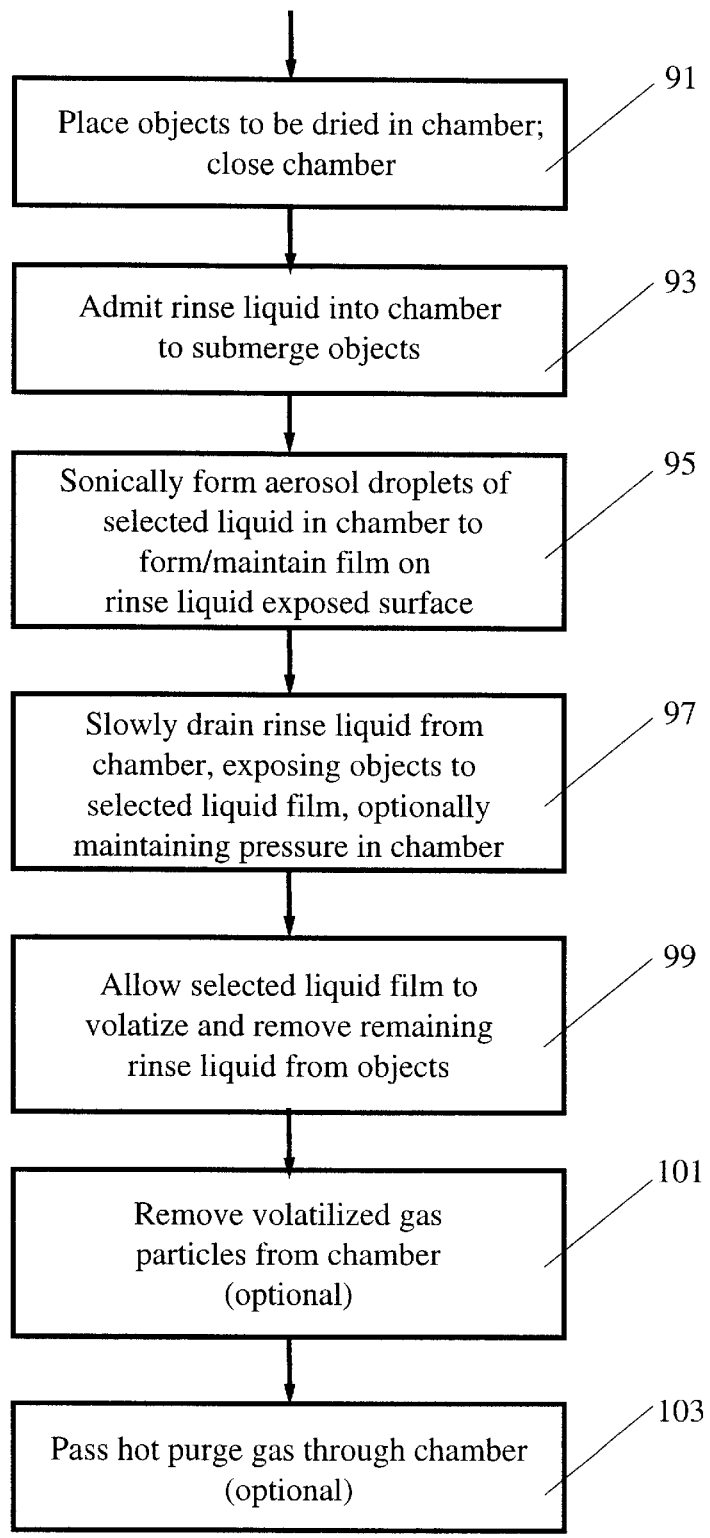
FIG. 4 is a flow chart of one embodiment of the method.

FIG. 4 is a flow chart indicating the process steps to be taken in one embodiment of the invention. In step 91, the objects 13A, 13B, 13C (FIGS. 1 and 3) to be dried and/or cleaned are placed into the chamber, and the chamber is closed. In step 93, rinse liquid 27 is admitted into the chamber to partially or (preferably) fully submerge the objects. In step 95, aerosol droplets of the selected liquid 37 are formed within the chamber, and a film of the selected liquid is formed and maintained on the exposed surface of the rinse liquid. In step 97, the rinse liquid 27 and any absorbed selected liquid 37 are slowly drained from the chamber, to ultimately expose the surfaces of the objects to the aerosol droplets and to allow films of the selected liquid to form on the objects surfaces; optionally, the chamber pressure is maintained near or above the external environment pressure. In step 99, the films of selected liquid on the objects' surfaces perform chemically squeegeeing to remove any remaining rinse liquid 27 and remaining selected liquid 37 and contaminants from the objects' surfaces. In step 101 (optional), any remaining selected liquid 37 and rinse liquid 27 are removed from the chamber. In step 103 (optional), a purge gas is passed through the chamber to remove any remaining gas and/or liquid particles from the chamber. The objects, now dried and/or cleaned, can be removed from the chamber or may be further processed in the chamber.

No matter what drain rate r1 is selected, removal of the rinse liquid 27 from the chamber 11 will produce a partial vacuum within the chamber that is not fully relieved by receipt within the chamber of the small amount of selected liquid from the drive head 61 and vibrating nozzle 63. If the chamber 11 is sufficiently air-tight, little or no gas from the external environment will enter the chamber in response to creation of this vacuum. However, many chambers are not sufficiently air-tight; and in such instances an appreciable amount of gas from the external environment, possibly bringing with this gas one or more contaminant particles that may settle on the exposed surfaces 14A, 14B, 14C of the selected objects 13A, 13B, 13C. This has been observed in some, but not all, of the tests of the procedure and apparatus disclosed here.

With reference to FIG. 3, a reservoir 121 of a substantially inert displacement gas 122, such as $N_2$, CO or $CO_2$, is optionally provided and is in fluid communication with the chamber 11. The inert gas 122 in the reservoir 121 passes through a port 123 and an associated valve and pressure control device 125 to enter the chamber 11. The valve and pressure control device 125 senses the changing pressure that is created within the chamber 11 as the rinse liquid 27 is drained from the chamber using the port and valve 41 and 43. In response to this changing pressure, the valve and pressure control device 125 allows sufficient inert gas 122 from the inert gas reservoir 121 to enter the chamber so that the chamber pressure is maintained at a pressure $p \approx p$ (external), where p(external) is approximately equal to the local pressure external to the chamber, or at a higher pressure. A chamber pressure p that is somewhat higher than the local external pressure p(external) is preferred here so that some of the inert gas 122 will tend to move out of the chamber 11 into the external environment and will discourage in-flow of gases from the external environment, if the chamber is not sufficiently air-tight. Optionally, the pressure p maintained within the chamber 11 may be somewhat less than p(external), perhaps as low as 0.8 p(external), and still discourage entry of gas from the external environment into the chamber. After the rinse liquid 27 is fully drained from the chamber 11 and the surfaces 14A, 14B and 14C of the selected objects 13A, 13B, 13C are fully dried and/or cleaned, the inert gas 122 may be removed from the chamber to an inert gas reservoir 127 before the next step is taken in processing the selected objects.

Alternatively, if the drain rate r1 for the rinse liquid 27 from the chamber 11 is controlled sufficiently well, the valve and pressure control device 125 need not sense the internal pressure of the chamber 11. In this approach, the valve and pressure control device 125 admits insert gas 122 at a programmed volume flow rate r3 from the inert gas reservoir 121, where the rate r3 is sufficient to maintain the internal pressure $p \approx p$(external) or higher within the chamber 11 as the rinse liquid 27 drains from the chamber.

The temperature T of the inert gas 122 is preferably at or near the temperature of the rinse liquid, which is usually room temperature or somewhat colder or somewhat warmer.

The purge gas reservoir 75 may also serve as the inert gas reservoir 121, with inclusion of the valve and pressure control device 125.

Figure 5:
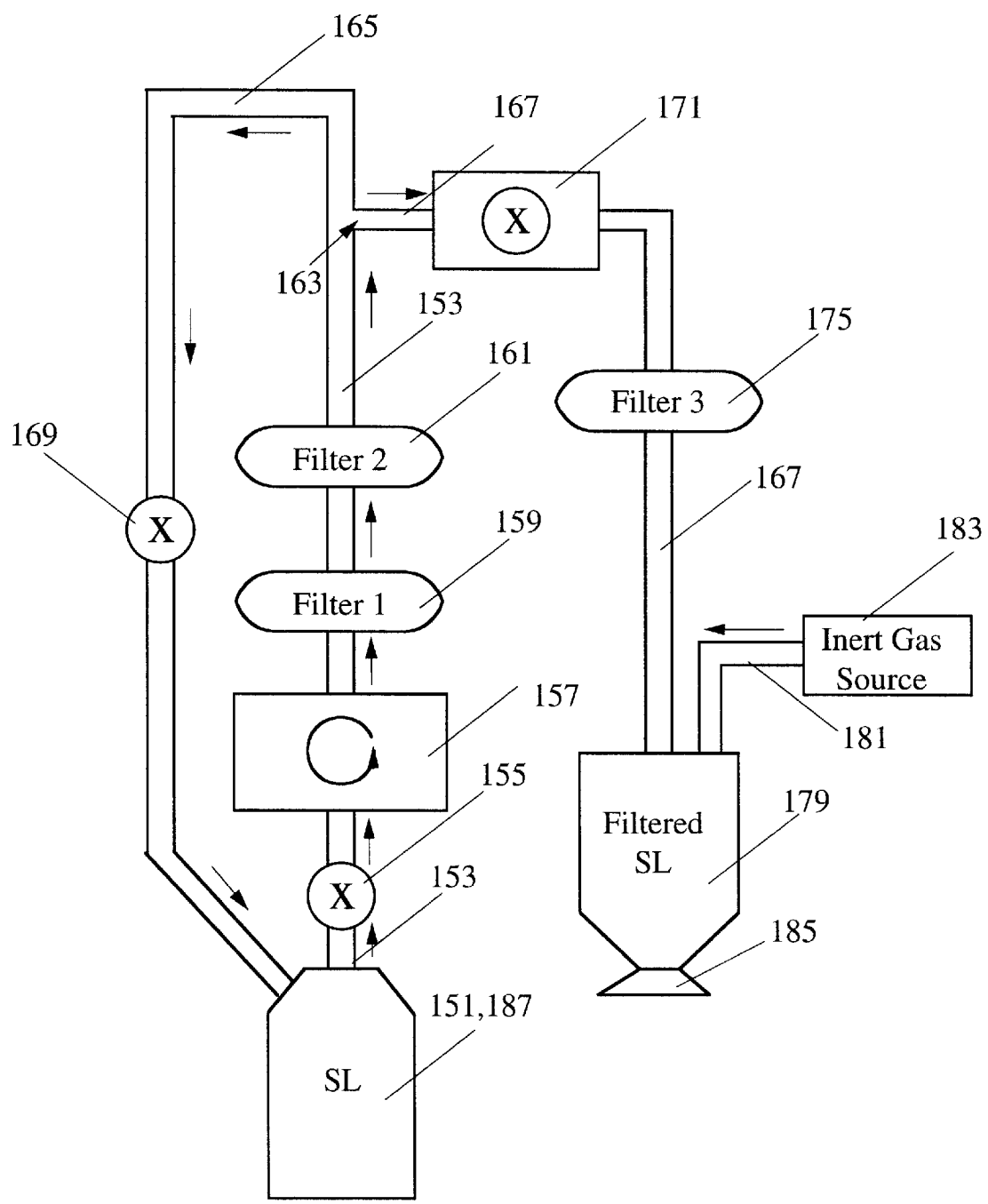
FIG. 5 is a schematic view of continuous filtering apparatus for a selected liquid according to the invention.

FIG. 5 illustrates improved flow filtering apparatus that is intended to keep the selected liquid (IPA or other) relatively free from contaminants with sizes above a relatively small diameter. A selected liquid (e.g., IPA or other) is held in an SL reservoir 151 and is pulled along a first fluid-carrying line 153 and through a first check valve 155 by a positive displacement pump 157 having a volume flow rate that is preferably in the range 1–10 LPM at room temperature. The selected liquid in the first line 153 passes through a first filter 159, preferably having a plurality of apertures with diameters in the range 0.1–0.2 $\mu$m, and through a second filter 161, preferably having a plurality of apertures with diameters in the range 0.02–0.1 $\mu$m (more preferably=0.05 $\mu$m). The first filter 159 removes most or all contaminant particles in the selected liquid with diameters greater than the first filter aperture diameter. The second filter 161 removes most or all contaminant particles in the selected liquid with diameters greater than the second filter aperture diameter, and more particularly removes any remaining contaminant particles with diameters greater than the first filter aperture diameter. Optionally, one of the first and second filters, 159 and 161, can be deleted.

The selected liquid then passes along the first line 153 to a junction 163 where this first line intersects with a second fluid-carrying line 165 and with a third fluid-carrying line 167. Selected liquid in the second line 165 passes through a second check valve 169 and is returned to the SL reservoir 151. Selected liquid in the third line 167 passes through a third check valve 171 (preferably a needle valve)and through a third filter 175 having a plurality of apertures with diameters in the range 0.02–0.1 $\mu$m (more preferably$\approx$0.05 $\mu$m). Selected liquid in the third line 167 is then received by a filtered SL reservoir 179 that is pressurized by inert gas from an inert gas line 181 that is fed by an inert gas source 183, which may hold $N_2$, CO or another suitable inert gas. The thrice-filtered selected liquid then passes through a vibrating head and nozzle 185 for cleaning and/or drying of an object. Optionally, the SL reservoir 151 has a pressure sensor and regulator 187 that uses pressure feedback to maintain approximately constant pressure in this reservoir.

Each of the three filters, 159, 161 and 175, is preferably a track-etched polycarbonate filter. The first and second fluid-carrying lines 153 and 165 are preferably teflon tubes with an inside diameter in the range 0.125–0.25 mm. The third fluid-carrying line 167 is preferably a teflon tube with an inside diameter in the range 0.1–0.2 mm.

When the second check valve 169 is in the open position and the third check valve 171 is in the closed position, selected liquid passes through the first and second filters, 159 and 161, flows in the first and second fluid- carrying lines, 153 and 165, and returns to the SL reservoir 151. When the second check valve 169 is in the closed position and the third check valve 171 is in the open position, selected liquid passes through the first, second and third filters, 159, 161 and 175, flows in the first and third fluid-carrying lines, 153 and 167, and passes through the nozzle 185. At least one of the second and third check valves 169 and 171 is open at any time so that the filtering action never stops and selected liquid circulates across two or three of the filters substantially continuously. Most of the contaminant particles in the selected liquid are removed in the first line-second line fluid route. Additional contaminant particles, if any are present, are removed by the first line-third line fluid route, which acts as a shunt to remove a selected fraction of the already-filtered selected liquid for further filtering.

Figure 6:
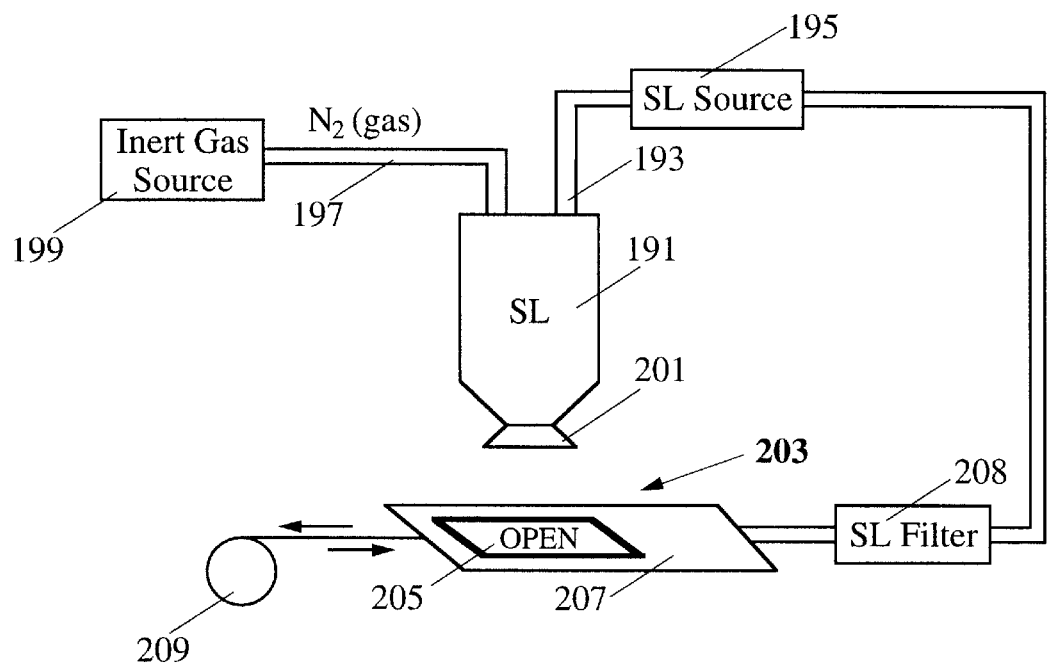
FIG. 6 is a schematic view of shutter apparatus that may be used with an aerosol production delivery system according to the invention.

FIG. 6 illustrates apparatus for suppressing or eliminating a "spike" of contaminant particles that appears when selected liquid (SL) delivery apparatus is activated after a substantial period of inactivity. An SL reservoir 191 is fed by an SL fluid line 193 from an SL source 195. The SL reservoir 191 is also pressurized by inert gas received in an inert gas line 197 from an inert gas source 199. The SL reservoir has a nozzle or other liquid outlet terminal 201 to allow SL to be delivered at a controllable rate for cleaning and/or drying of an object. A liquid flow mask 203, having an open section 205 and an opaque section 207, is located adjacent to the nozzle 201 and is movable in a direction transverse to the normal direction of SL flow by a motor or other manual or automatic mask movement mechanism 209. The redirected SL liquid is passed through one or more SL filters 208 before returning to the SL source 195. The mask 203 acts in a manner similar to the action of a focal plane shutter in a camera and is preferably fabricated from a relatively inert material such as Gore-Tex. Any other means of liquid redirection can be used to direct an initial amount of SL through a (special) SL filter to remove most or all of a "spike" of contaminant particles that appears when the system is first activated.

When the SL delivery apparatus, of which the SL reservoir 191 is a part, is activated after being unused for a substantial time period, the opaque portion of the mask 203 is positioned across the nozzle 201, in order to interfere with and redirect the initial SL flow. The SL that flows initially (immediately after the system is activated) is likely to have a larger-than-normal number of contaminant particles therein, which may have accumulated in the SL delivery apparatus (SL reservoir, SL delivery lines, etc.) during the preceding period of inactivity. Selected liquid in this initial SL flow is preferably redirected through a separate liquid filtering system (not shown in FIG. 6) to remove the larger-than-normal number of contaminant particles from the liquid. After a selected time interval, which may be as short as a few seconds and as long as 60–120 seconds, the mask 203 is moved transversely by the movement mechanism 209 to position the open section 207 of the mask 203 in the normal path of SL flow from the nozzle 201. At this point, the SL is permitted to flow from the SL reservoir 191, through the nozzle 201 and through the normal channel(s) for SL delivery for cleaning and/or drying of an object.

Figure 7:
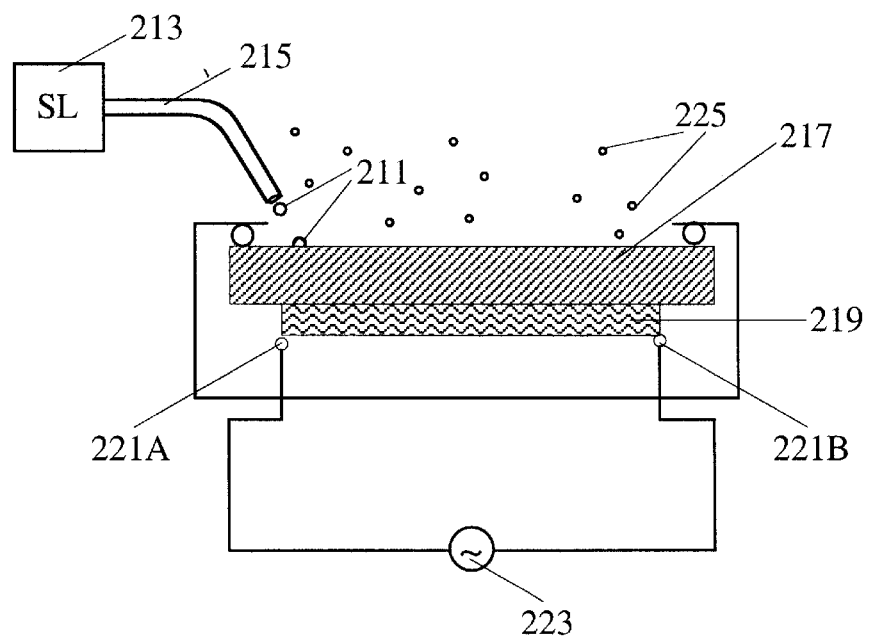
FIG. 7 is a schematic view of aerosol production apparatus according to the invention.

FIG. 7 illustrates improved aerosol production apparatus. Relatively large drops 211 of a selected liquid (SL) from an SL reservoir 213 are delivered by one or more fluid-carrying lines 215 and deposited on an exposed surface of a suitable solid receptor 217. The fluid-carrying line 215 preferably allows an SL flow rate of 0.1–10 ml/min. The size of the SL drops may be as small as permitted by the surface tension of the SL, or larger if desired. The solid receptor 217 is preferably a chemically inert material, such as silicon nitride ($Si_3N_4$), silicon nitride hydride ($Si_xN_yH_z$) or any other suitable material. The solid receptor 217 is contiguous, on one side or at the bottom, to a piezoelectric (PZT) crystal 219. The PZT crystal 219 is electrically driven by two or more electrodes 221A and 221B that are in turn driven by an alternating voltage device 223. Preferably, the alternating voltage device 223 provides alternating voltage at one or more frequencies in the range 20–5,000 kHz, and more preferably in the range 20–750 kHz.

As the PZT crystal 219 expands and contracts in response to the imposed alternating voltage, the solid receptor 217 vibrates, and a deposited drop of SL 211 is separated into a plurality of smaller (aerosol) particles 225 with diameters preferably in the range 1–50 μm. These smaller aerosol particles 225 are thrown off of, or otherwise depart from, the solid receptor 217 and are subsequently used for cleaning and/or drying an object. As the drive frequency f for the PZT crystal 219 is increased, the average diameter of the aerosol particles produced by this apparatus should decrease.

What is claimed is:

1. Apparatus for drying and cleaning an object, the apparatus comprising:
    an enclosed chamber that receives and contains a selected object to be cleaned and dried, the enclosed chamber having an openable entryway that allows the selected object to be placed into, and to be removed from, the enclosed chamber, the enclosed chamber having a first aperture in fluid communication with a rinse liquid source that delivers a rinse liquid having a selected surface tension into the enclosed chamber to clean the selected object by partly or fully submerging the selected object in the rinse liquid, and the enclosed chamber having a second aperture that allows the rinse liquid to exit from the enclosed chamber at a volume flow rate r1 that lies in a first selected volume flow range;
    a first selected liquid reservoir in fluid communication with the enclosed chamber for delivering a selected liquid to the enclosed chamber, wherein the selected liquid has a surface tension that is substantially lower tn the surface tension of the rinse liquid;
    ultrasonic drive means for drying the object by forming a film of aerosol particles of the selected liquid on a surface of the rinse liquid the ultrasonic drive means comprising;
    a vibrating head, having a head axis and having a third aperture that is in fluid communication with the enclosed chamber, that receives the selected liquid at a volume flow rate r2 that lies in a second selected volume flow range and vibrates to cause the selected liquid to form aerosol particles within the enclosed chamber so that a film of aerosol particles of the selected liquid is formed on the rinse liquid surface to remove rinse liquid from at least one surface of the object;
    a inert gas plenum having a plenum aperture and being located adjacent to the vibrating head; and
    an inert gas source, connected to the ultrasonic drive means, to deliver an inert gas into the inert gas plenum such that the inert gas is expelled from the inert gas plenum at the plenum aperture in one or more, elected directions to cause the aerosol particles to move away from the vibrating head at increased angles relative to the vibrating head axis, relative to movement of the aerosol particles when the inert gas source is not present.

2. The apparatus of claim 1, further comprising a mask, positioned within said chamber to receive particles leaving said vibrating head and traveling substantially parallel to said vibrating head axis.

3. The apparatus of claim 1, wherein said inert gas source allows said inert gas to be introduced adjacent to said vibrating head at a controllable, time varying gas pressure.

4. The apparatus of claim 1, wherein said vibrating head vibrates at at least one frequency f that lies in the range $10 \text{ kHz} \leq f \leq 10,000 \text{ kHz}$.

5. The apparatus of claim 1, wherein said selected liquid is chemically substantially unreactive with said selected object.

6. The apparatus of claim 1, wherein said rate r1 in said first selected volume flow range is chosen so that the depth of said rinse liquid in said enclosed chamber decreases at a rate of between 3 mm/sec and 10 mm/sec.

7. The apparatus of claim 1, wherein said rate r2 in said second selected volume flow range lies in a range 1 m/min$\leq$r2$\leq$5 ml/mm.

8. The apparatus of claim 1, wherein said selected liquid is received within said enclosed chamber at a pressure p lying in the range 5 psi$\leq$p$\leq$50 psi.

9. The apparatus of claim 1, wherein said first selected liquid reservoir is connected to said vibrating head and is located outside of said enclosed chamber.

10. The apparatus of claim 1, further comprising a fourth aperture in said enclosed chamber for allowing said selected liquid and said aerosol particles to exit from said enclosed chamber.

11. The apparatus of claim 1, wherein said inert gas is maintained at about room temperature.

12. The apparatus of claim 1, wherein substantially all of said aerosol particles are formed within said enclosed chamber without a change in phase of said selected liquid.

13. The apparatus of claim 1, wherein said aerosol particles are formed within said enclosed chamber with an energy expenditure of less than 100 Joules per gram.

14. The apparatus of claim 1, further comprising:

a source of substantially inert gas;

a fourth aperture in said enclosed chamber, connected to the inert gas source, that admits inert gas from the inert gas source into said enclosed chamber; and a fifth aperture in said enclosed chamber, which may coincide with the fourth aperture, that allows the inert gas within said enclosed chamber to exit from said enclosed chamber.

15. The apparatus of claim 1, further comprising:

a first liquid filtering means, connected to the fir selected liquid reservoir and operated substantially continuously, to remove contaminant particles from said selected liquid and to return most or all of said selected liquid, after filtering, to the first selected liquid reservoir.

16. The apparatus of claim 1, further comprising:

a flow deflector, located adjacent to said vibrating head, that initially receives and redirects all flow of said selected liquid for a selected time interval, when said apparatus is activated after a period of inactivity, and that allows said selected liquid to flow without interference after the selected time interval; and filtering means to receive and filter said selected liquid from the flow deflector.

17. The apparatus of claim 3, wherein said time varying gas pressure is approximately periodic in time.

18. The apparatus of claim 4, wherein said frequency f is chosen so that at least one of said aerosol particles has a diameter d lying in the range 10 $\mu$m$\leq$d$\leq$50 $\mu$m.

19. The apparatus of claim 4, wherein said vibrating head vibrates at at least one frequency f that lies in the range 20 kHz$\leq$f$\leq$100 kHz.

20. The apparatus of claim 5, wherein said selected liquid is drawn from a class of substantially unreactive liquids consisting of isopropyl alcohol, ethyl alcohol, methyl alcohol, tetrahydrofuran, acetone, perfluorohexane, hexane and ether.

21. The apparatus of claim 9, wherein said first selected liquid reservoir is located at least one meter from said enclosed chamber.

22. The apparatus of claim 9, wherein said first selected liquid reservoir holds a volume V of said selected liquid that is no greater than 25 ml.

23. The apparatus of claim 15, further comprising:

a second liquid filtering means, connected to said first liquid filtering means, to receive a selected fraction of said filtered selected liquid and to apply further filtering to said liquid received; and a second selected liquid reservoir to receive said liquid from the second liquid filtering means, where at least one of said first selected liquid reservoir and the second selected liquid reservoir provides said selected liquid for said vibrating head.

\* \* \* \* \*